US012796567B2

(12) United States Patent
Chou et al.

(10) Patent No.: US 12,796,567 B2
(45) Date of Patent: Nov. 10, 2026

(54) EMBEDDED INTEGRATED VOLTAGE REGULATOR

(71) Applicant: Taiwan Semiconductor Manufacturing Co., Ltd., Hsinchu (TW)

(72) Inventors: Chih-Chao Chou, Hsinchu (TW); Chih-Hao Wang, Baoshan Township (TW); Ching-Wei Tsai, Hsinchu (TW); Yi-Hsun Chiu, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 405 days.

(21) Appl. No.: 18/603,073

(22) Filed: Mar. 12, 2024

(65) Prior Publication Data

US 2025/0174597 A1 May 29, 2025

Related U.S. Application Data

(60) Provisional application No. 63/603,817, filed on Nov. 29, 2023.

(51) Int. Cl.
*H10W 90/00* (2026.01)
*H10W 70/685* (2026.01)

(52) U.S. Cl.
CPC ......... *H10W 90/00* (2026.01); *H10W 70/685* (2026.01); *H10W 90/701* (2026.01); *H10W 90/722* (2026.01); *H10W 90/724* (2026.01); *H10W 90/792* (2026.01); *H10W 90/794* (2026.01)

(58) Field of Classification Search
CPC . H10W 90/00; H10W 70/685; H10W 90/701; H10W 90/722; H10W 90/724; H10W 90/792; H10W 90/794
See application file for complete search history.

(56) References Cited

U.S. PATENT DOCUMENTS

| | | | | |
|---|---|---|---|---|
| 12,165,981 | B2 * | 12/2024 | Loh | G05F 1/575 |
| 2015/0162448 | A1 | 6/2015 | Raghavan et al. | |
| 2020/0168634 | A1 * | 5/2020 | Sharma | H10D 87/00 |
| 2022/0077109 | A1 * | 3/2022 | Chava | H10W 90/00 |
| 2022/0102344 | A1 | 3/2022 | Then et al. | |
| 2022/0360073 | A1 * | 11/2022 | Fan | H02H 9/046 |
| 2025/0343127 | A1 * | 11/2025 | Chou | H10W 70/65 |

FOREIGN PATENT DOCUMENTS

WO 2023049132 A1 3/2023

* cited by examiner

*Primary Examiner* — Mamadou L Diallo
(74) *Attorney, Agent, or Firm* — Slater Matsil, LLP

(57) ABSTRACT

A method includes forming integrated circuit devices on a semiconductor substrate of a wafer, forming a voltage regulator in the wafer, and forming a metal layer as a part of the wafer. A transistor is formed farther away from the semiconductor substrate than the metal layer. The transistor includes a first source/drain region connected to the voltage regulator, and the voltage regulator is configured to convert a first voltage received from the first source/drain region to a second voltage that is lower than the first voltage, and provide the second voltage to the integrated circuit devices. An electrical connector is formed on a surface of the wafer, and is electrically connected to a second source/drain region of the transistor.

20 Claims, 15 Drawing Sheets

EMBEDDED INTEGRATED VOLTAGE REGULATOR

PRIORITY CLAIM AND CROSS-REFERENCE

This application claims the benefit of the following provisionally filed U.S. Patent application: Application No. 63/603,817, filed on Nov. 29, 2023, and entitled "EMBEDDED INTEGRATED VOLTAGE REGULATOR," which application is hereby incorporated herein by reference.

BACKGROUND

Integrated circuits may need a plurality of levels of power supply voltages. For example, the power supply voltages used by integrated circuits may include 12V, 5V, 3.3V, and 0.9V. Accordingly, a plurality of voltage regulators may be used to generate different levels of voltages. The plurality of voltage regulators may be located in multiple dies to achieve voltage conversion to different levels of voltages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
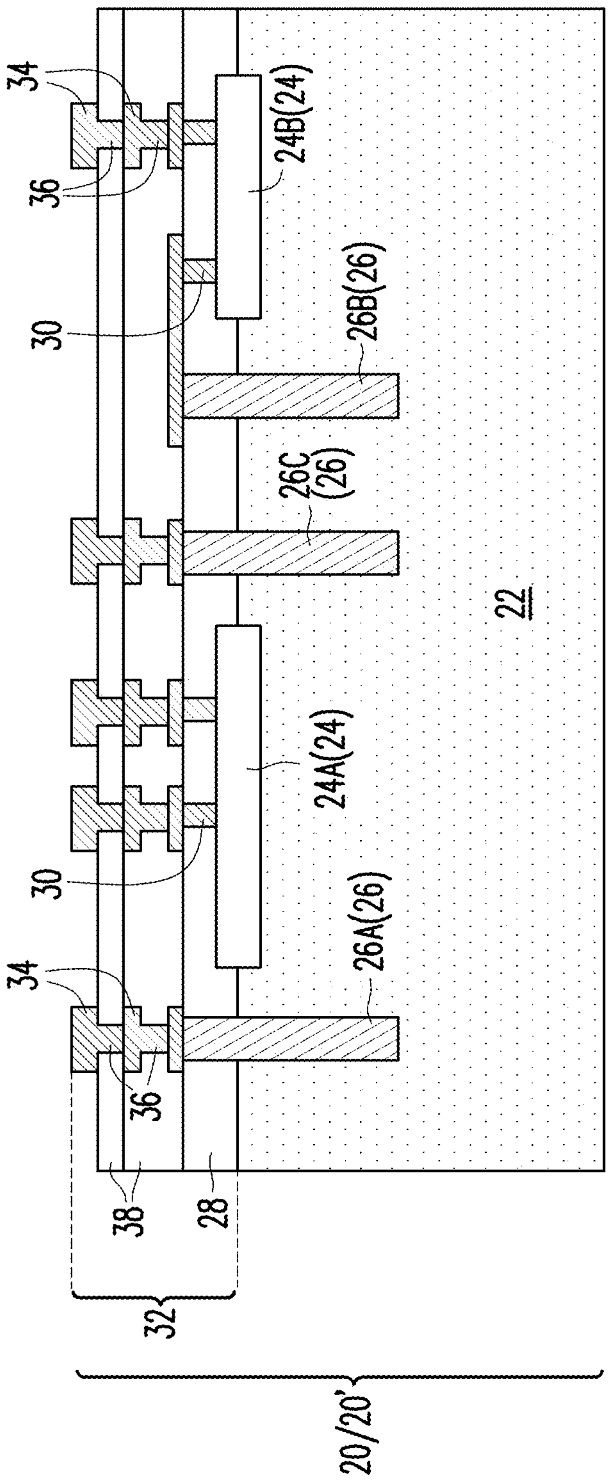
FIGS. 1-6 illustrate the cross-sectional views of intermediate stages in the formation of dies including embedded voltage regulators in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A device die including an embedded voltage regulator is provided. The embedded voltage regulator further includes a power switch formed in a Back-End-of-Line (BEOL) structure or a backside interconnector structure of the device die. The method of forming the device die are also provided. In accordance with some embodiments of the present disclosure, a higher power supply voltage is provided into the device die, and is converted into lower power supply voltages by an embedded voltage regulator(s), which is embedded inside the device die. The embedded voltage regulator may further include a power switch formed of a thin-film transistor as a part of its control circuit. The thin-film transistor may be an InGaZnO (IGZO) transistor, which is formed in the BEOL structure of the device die or a backside interconnect structure of the device die. By forming the embedded voltage regulator inside the device die, the power loss due to the lower power supply voltages is reduced.

Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 6 illustrate the cross-sectional views of intermediate stages in the formation of a device die in accordance with some embodiments of the present disclosure. The corresponding processes are also reflected schematically in the process flow shown in FIG. 15.

FIG. 1 illustrates a cross-sectional view of wafer 20. In accordance with some embodiments, wafer 20 is or comprises a device wafer including active devices and possibly passive devices, which are represented as integrated circuit devices 24. Wafer 20 may include a plurality of chips/dies 20' therein, with one of chips 20' being illustrated.

In accordance with some embodiments, wafer 20 includes semiconductor substrate 22 and the features formed at a top surface of semiconductor substrate 22. Semiconductor substrate 22 may be formed of or comprise crystalline silicon, crystalline germanium, crystalline silicon germanium, crystalline carbon-doped silicon, or a III-V compound semiconductor such as GaAsP, AlInAs, AlGaAs, GaInAs, GaInP, GaInAsP, or the like. Shallow Trench Isolation (STI) regions (not shown) may be formed in semiconductor substrate 22 to isolate the active regions in semiconductor substrate 22.

Figure 15:
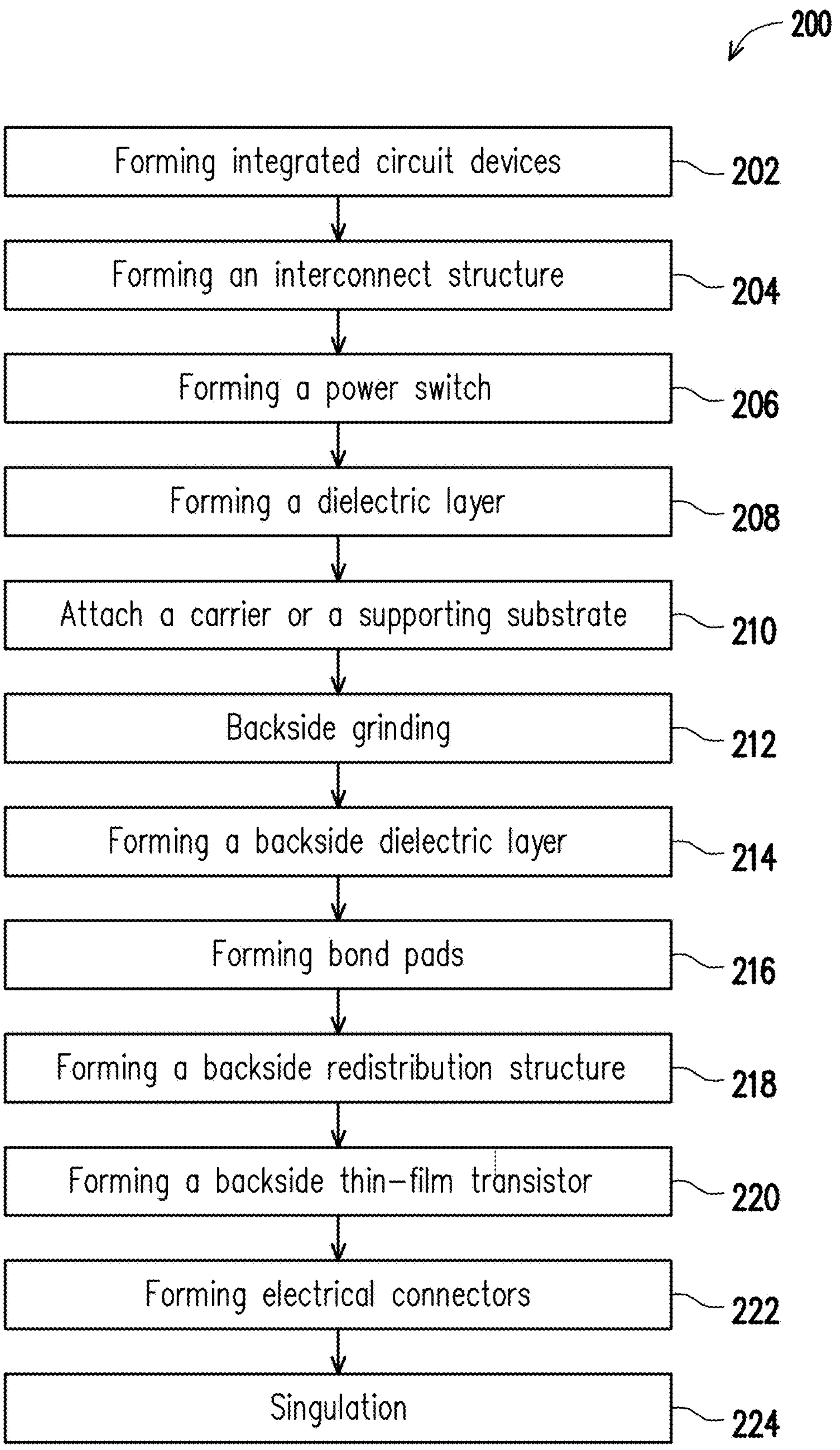
FIG. 15 illustrates a process flow for forming a device die including an embedded voltage regulator in accordance with some embodiments.

In accordance with some embodiments, integrated circuit devices 24 are formed on the top surface of semiconductor substrate 22, and are collectively referred to as Front-end-of-line (FEOL) structures. The respective process is illustrated as process 202 in the process flow 200 as shown in FIG. 15. Integrated circuit devices 24 may include Complementary Metal-Oxide Semiconductor (CMOS) transistors, resistors, capacitors, diodes, and/or the like in accordance with some embodiments. In accordance with some embodiments, integrated circuit devices 24 include integrated circuit devices 24A that is powered by a gated power and integrated circuit devices 24B powered by un-gated power, as discussed in detail in subsequent paragraphs.

Figure 2:
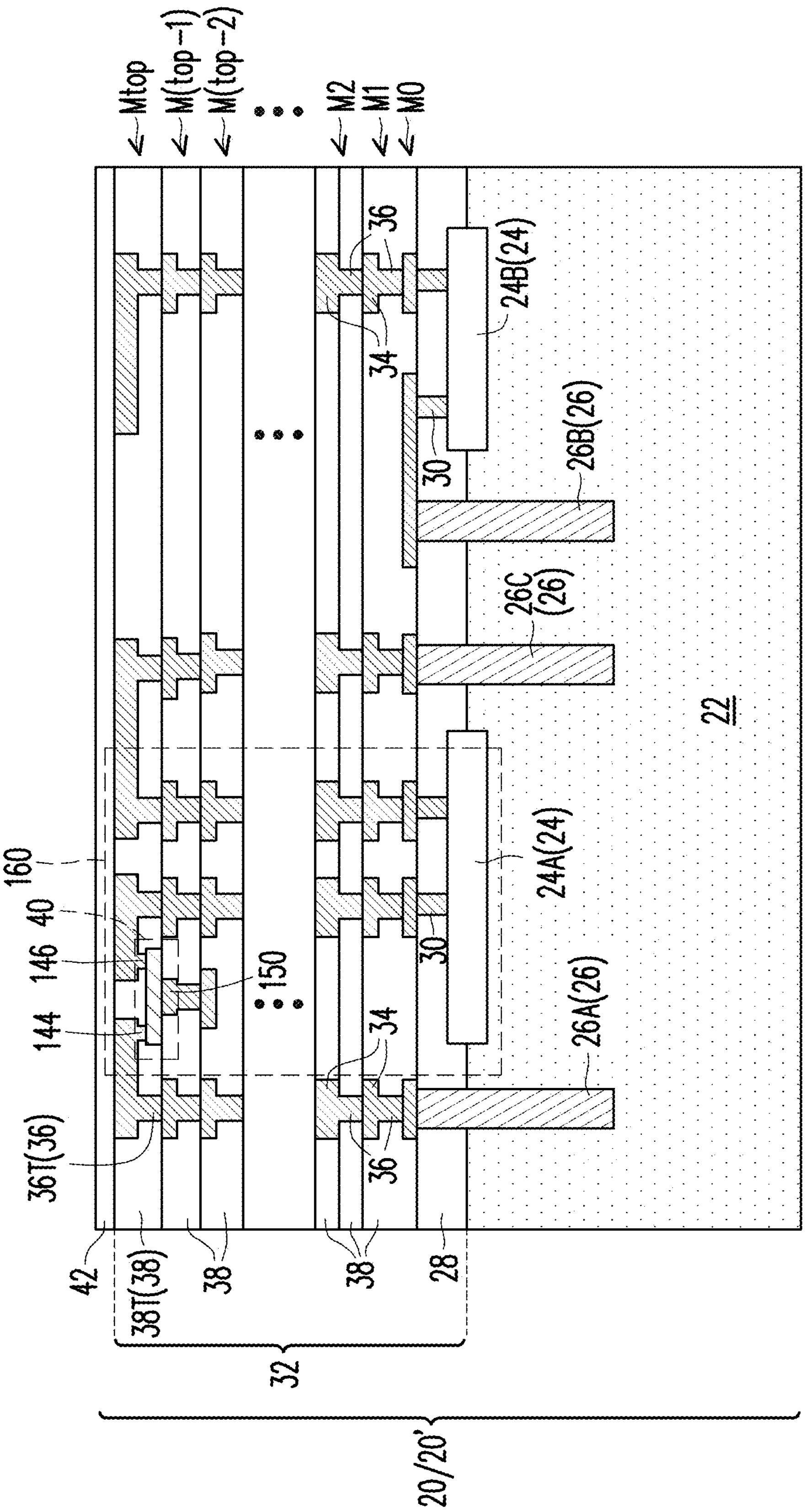

As shown in FIGS. 1 and 2, interconnect structure 32 is formed over, and is electrically connected to, integrated circuit devices 24. The respective process is illustrated as process 204 in the process flow 200 as shown in FIG. 15. In accordance with some embodiments, interconnect structure 32 includes Inter-Layer Dielectric (ILD) 28 formed over semiconductor substrate 22 and filling the spaces between the gate stacks of transistors (not shown) in integrated circuit devices 24. In accordance with some embodiments, ILD 28 is formed of silicon oxide, Phospho Silicate Glass (PSG), Boro Silicate Glass (BSG), Boron-doped Phospho Silicate Glass (BPSG), Fluorine-doped Silicate Glass (FSG), or the like. ILD 28 may be formed through spin coating, Flowable Chemical Vapor Deposition (FCVD), or the like. In accordance with some embodiments, ILD 28 may also be formed using a deposition method such as Plasma Enhanced Chemical Vapor Deposition (PECVD), Low Pressure Chemical Vapor Deposition (LPCVD), or the like.

Contact plugs 30 are formed in ILD 28, and are used to electrically connect integrated circuit devices 24 to overlying metal lines and vias. In accordance with some embodiments, contact plugs 30 are formed of or comprise a conductive material selected from tungsten, aluminum, copper, titanium, tantalum, titanium nitride, tantalum nitride, alloys therefore, and/or multi-layers thereof. The formation of contact plugs 30 may include forming contact openings in ILD 28, filling a conductive material(s) into the contact openings, and performing a planarization process (such as a Chemical Mechanical Polish (CMP) process or a mechanical grinding process) to level the top surfaces of contact plugs 30 with the top surface of ILD 28.

In accordance with some embodiments, through-vias 26 (alternatively referred to as Through-silicon-vias (TSVs) or through-Semiconductor-vias (also TSVs)) are formed in wafer 20. Through-vias 26 may extend from the top surface to an intermediate level between the top surface and the bottom surface of semiconductor substrate 22. The top ends of through-vias 26 may extend to the top surface of ILD 28. Alternatively, the top ends of through-vias 26 may be at any available levels such as the top surface level of semiconductor substrate 22, or a top surface level of any one of dielectric layers 38. Each of through-vias 26 may be encircled by a dielectric isolation layer (not shown), which electrically insulates the respective through-via 26 from semiconductor substrate 22.

In accordance with some embodiments such as what are illustrated in FIG. 1, the formation of through-vias 26 includes a through-via-first process or a through-via-middle process, in which through-vias 26 are formed from the front side of semiconductor substrate 22. In accordance with alternative embodiments, a through-via-last process may be adopted to form through-vias 26, and the through-vias 26 may be formed from the backside of wafer 20.

Through-vias 26 include power through-vias 26A for conducting un-gated power, and through-vias 26B for conducting signal. There may be, or may not be, additional through-vias such as through-vias 26C, which are also used for conducting gated power, which gated power may be gated on the backside of semiconductor substrate 24.

Referring to FIGS. 1 and 2, more metal layers and dielectric layers are formed to extend interconnect structure 32 upwardly. Interconnect structure 32 further includes dielectric layers 38 (also referred to as Inter-metal Dielectrics (IMDs)), etch stop layers (not shown), and metal lines 34 and vias 36 formed in dielectric layers 38. The metal lines at a same level are collectively referred to as a metal layer hereinafter. In accordance with some embodiments, interconnect structure 32 includes a plurality of metal layers (M0 through Mtop) including metal lines 34 that are interconnected through vias 36. The metal layers in interconnect structure 32 may be denoted as M0, M1, M2, M3, and the like.

Metal lines 34 and vias 36 may be formed of copper or copper alloys, and can also be formed of or comprise other metals such as aluminum, tungsten, nickel, or the like. In accordance with some embodiments, dielectric layers 38 are formed of low-k dielectric materials. The dielectric constants (k values) of the low-k dielectric materials may be lower than about 3.5 or lower than about 3.0, for example. Dielectric layers 38 may comprise a carbon-containing low-k dielectric material, Hydrogen SilsesQuioxane (HSQ), MethylSilsesQuioxane (MSQ), or the like. The etch stop layers may be formed of or comprise aluminum oxide, aluminum nitride, SiOC, SiON, or the like, or multi-layers thereof.

The formation of metal lines 34 and vias 36 in dielectric layers 38 may include single damascene processes and/or dual damascene processes. In a single damascene process for forming a metal line or a via, a trench or a via opening is first formed in one of dielectric layers 38, followed by filling the trench or the via opening with a conductive material. A planarization process such as a CMP process is then performed to remove the excess portions of the conductive material higher than the top surface of the dielectric layer, leaving a metal line or a via in the corresponding trench or via opening.

In a dual damascene process, both of a trench and a via opening are formed in a dielectric layer, with the via opening underlying and connected to the trench. Conductive materials are then filled into the trench and the via opening to form a metal line and a via, respectively. The conductive materials may include a diffusion barrier layer and a copper-containing metallic material over the diffusion barrier layer. The diffusion barrier layer may include titanium, titanium nitride, tantalum, tantalum nitride, or the like.

The top metal layer is referred to as metal layer Mtop, the metal layer immediately under metal layer Mtop is referred to as metal layer M(top-1), and the metal layer immediately under metal layer M(top-1) is referred to as metal layer M(top-2), and so on. In accordance with some embodiments, the total number of metal layers may be greater than about 9, and may be in the range between about 9 and 16. In accordance with some embodiments, the top metal layer Mtop is formed in dielectric layer 38T, which is the top layer of dielectric layers 38. Dielectric layer 38T may be formed of or comprise a low-k dielectric material, as discussed above. Alternatively, dielectric layer 38T may be formed of or comprise a non-low-k dielectric material such as undoped Silicate Glass (USG), silicon oxide, silicon oxynitride, silicon nitride, or the like, or combinations thereof.

In accordance with some embodiments, in the same formation process of integrated circuit devices 24 and the overlying interconnect structure 32 (FIG. 6), voltage regulator circuits 160 are formed. Voltage regulator circuits 160 are configured to convert higher power supply voltages such as 12V into lower voltages such as 5V, 3.3V, 1.2V, 0.9V, 0.75V, or the like, and may also be configured to convert the converted lower power supply voltages (such as 5V or 3.3V) to further lower power supply voltages such as 3.3V, 1.2V, 0.9V, 0.75V, or the like. In addition, voltage regulator circuits 160 may include one or more power switch(es) (such as thin-film transistors 40 and 40' (interchangeably referred to as power switches) in FIG. 6) for controlling whether, and when, to provide power supply voltages to some circuits, but not to other circuits.

In accordance with some embodiments, thin-film transistor 40 is formed as a power switch in one of the metal layers, or between two neighboring metal layers. The respective process is illustrated as process 206 in the process flow 200 as shown in FIG. 15. In accordance with some example embodiments, as shown in FIG. 2, thin-film transistor 40 is formed in a top position of the interconnect structure 32, such as between metal layers Mtop and M(top-1).

Dielectric layer 42 may be formed over top metal layer Mtop and the top dielectric layer 38T. The respective process is illustrated as process 208 in the process flow 200 as shown in FIG. 15. In accordance with some embodiments, dielectric layer 42 may be formed of or comprise a silicon-based dielectric material such as SiO, SiN, SiON, SiOCN, SiOC, or the like, combinations thereof, or multi-layers thereof. Dielectric layer 42 may sometimes be used for bonding to a supporting substrate, and hence may be referred to as a bond layer hereinafter.

Forming thin-film transistor 40 in a top position of interconnect structure 32 has some advantageous features. The thin-film transistor 40 is used as a power switch. Accordingly, the size (and the occupied chip area) of thin-film transistor 40 is large. For example, the chip area occupied by thin-film transistor(s) 40 in a device die may range between about 4 percent and about 8 percent of the device die. The upper metal layers have large pitches and large metal line widths that fit the formation of thin-film transistor 40. Also, the upper metal layers have greater thicknesses and greater distances from their neighboring metal layers, and the process difficulty in the formation of thin-film transistor 40 is reduced.

Figure 7:
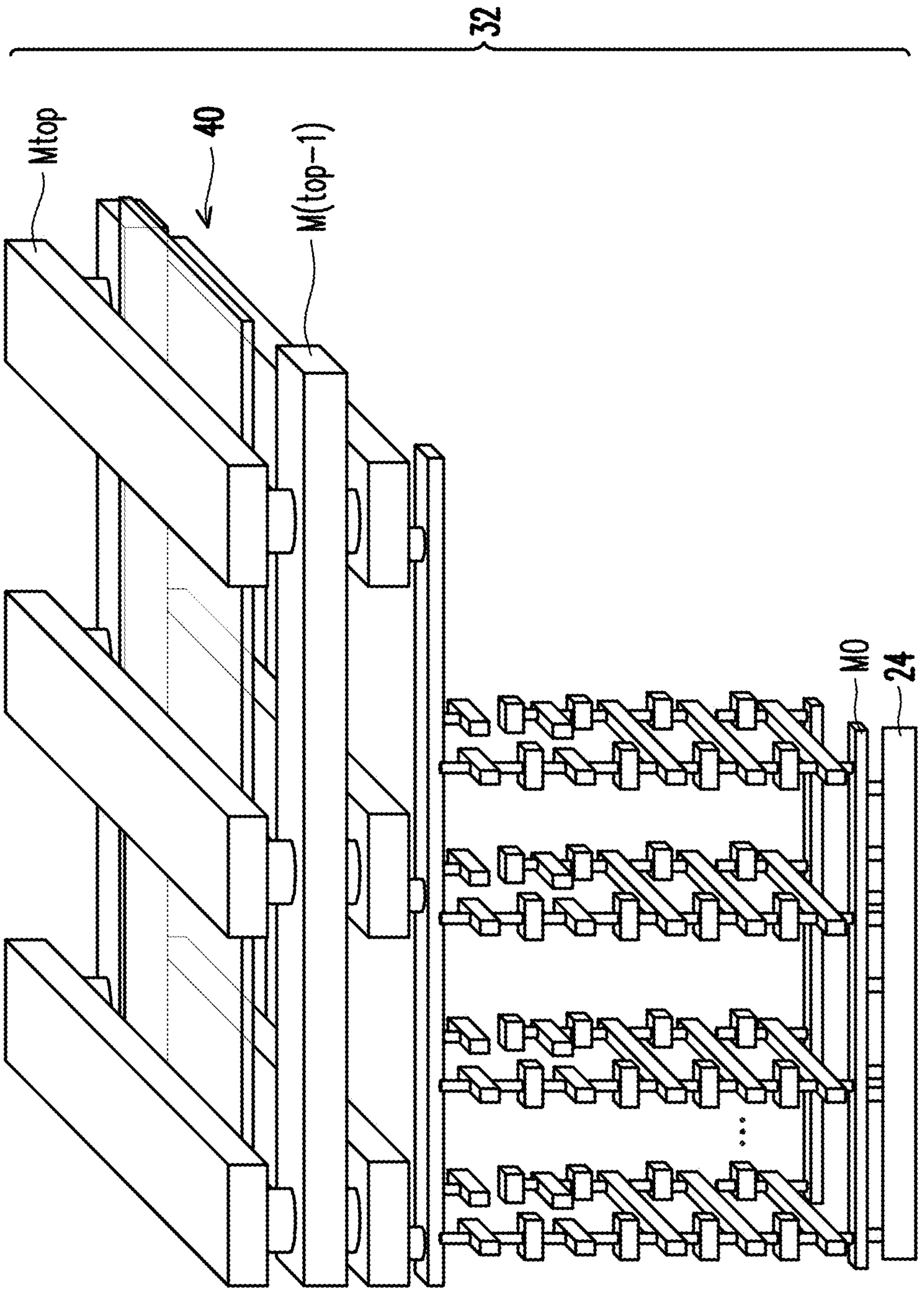
FIGS. 7-11 illustrate views of a power switch used for embedded voltage regulators in accordance with some embodiments.

FIG. 7 illustrates a perspective view of thin-film transistor 40 and the underlying metal layers in accordance with some embodiments. Integrated circuit devices 24 and M0 power rails are also illustrated schematically to show the position of thin-film transistor 40.

Figure 8:
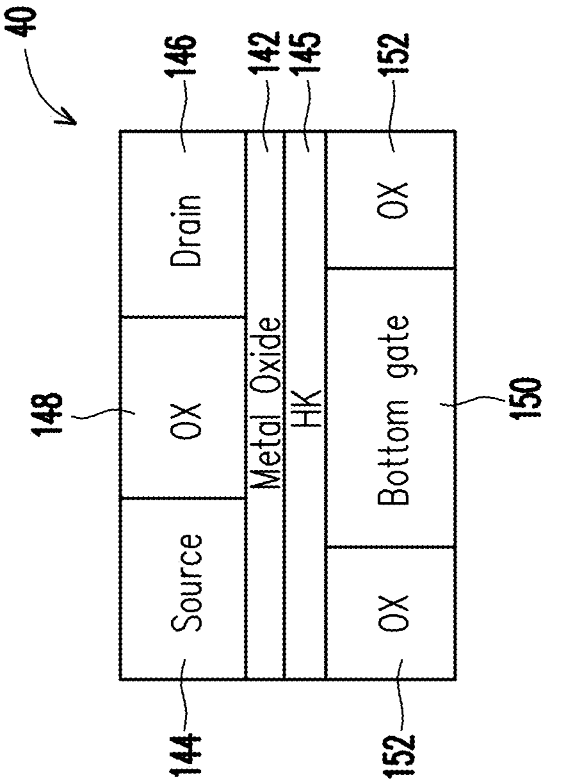

FIG. 8 illustrates a cross-sectional view of thin-film transistor 40 in accordance with some embodiments. In accordance with some embodiments, thin-film transistor 40 is formed on the front side of semiconductor substrate 22 as a power switch. In accordance with alternative embodiments, the front-side thin-film transistor 40 is not formed. Rather, a backside power switch is formed. Thin-film transistor 40 may include channel layer 142, which may be formed of or comprise a metal oxide. For example, channel layer 142 may comprise InGaZnO (IGZO), which is a semiconductor. In accordance with some embodiments, source region 144 and drain region 146 are in contact with channel layer 142, and are spaced apart from each other by dielectric layer 148. Gate dielectric 145 may be under channel layer 142, and may be formed of a high-K (HK) dielectric material. Bottom gate 150 may be underlying and in contact with gate dielectric 145. Dielectric regions/layer 152 are formed to surround bottom gate 150.

In the illustrated example, thin-film transistor 40 is a bottom-gate transistor. In accordance with alternative embodiments, thin-film transistor 40 is a top-gate transistor. In accordance with yet alternative embodiments, thin-film transistor 40 may be a double-gate transistor including both of a top gate and a bottom gate.

In accordance with some embodiments, as shown in FIG. 2, thin-film transistor 40 may be formed between metal layers Mtop and M(top-1). For example, thin-film transistor 40 may be formed at the same level as the vias 36T (FIG. 2), which is between metal layers Mtop and M(top-1). In accordance with alternative embodiments, depending on how many integrated circuits are powered by the gated power, and depending on the corresponding routing requirement, thin-film transistor 40 may be formed in any of the underlying layer such as between metal layers M(top-1) and M(top-2), between metal layers M(top-2) and M(top-3) . . . between metal layers M3 and M2, or between metal layers M2 and M1.

Also, there may be a plurality of thin-film transistors 40 (as power switches) formed at different levels. For example, when thin-film transistor 40 is formed between metal layers Mtop and M(top-1), there may be other thin-film transistors 40 formed between metal layers M(top-1) and M(top-2), between metal layers M(top-2) and M(top-3), and/or at other levels. Forming multiple thin-film transistors 40 at different levels may save more chip area, so that the multiple thin-film transistors 40 do not compete for the same chip area. Also, upper thin-film transistors 40 may support more circuits due to that more metal layers may be used for routing their power, while lower thin-film transistors 40 may support fewer circuits.

Figure 9:
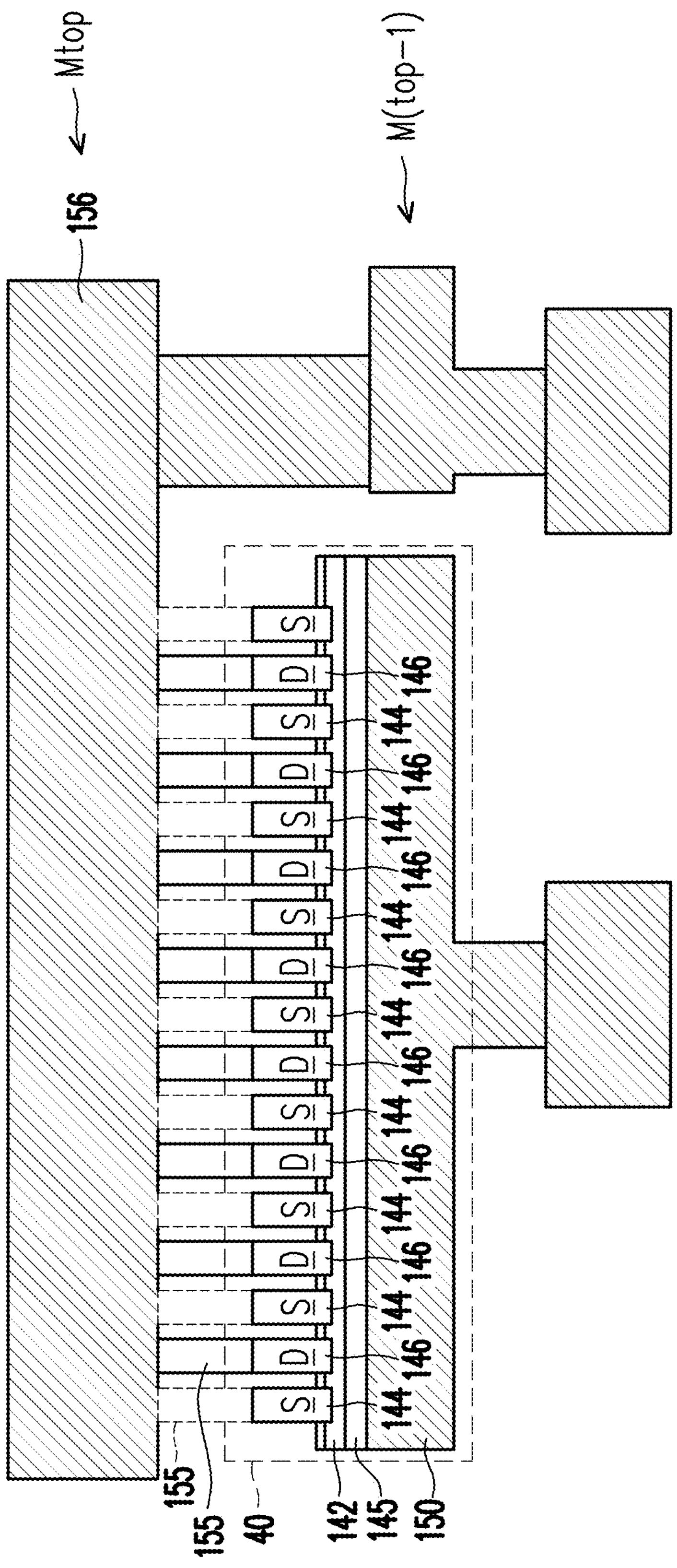

An example formation process of thin-film transistor 40 is briefly discussed herein. In subsequent discussion, it is assumed that bottom gate 150 is formed over metal layer M(top-1). In accordance with some embodiments, metal layer M(top-1) is formed. The bottom gate 150 as shown in FIG. 8 may be a part of the metal layer M(top-1) in accordance with some embodiments, as also shown in FIG. 9. Alternatively, the bottom gate 150 as shown in FIG. 8 is formed as being over and contacting a metal line in the metal layer M(top-1).

In accordance with some embodiments, as shown FIG. 8, dielectric layer 152 is deposited. Dielectric layer 152 may comprise silicon oxide, silicon nitride, silicon oxynitride, or the like. Next, bottom gate 150 is formed in dielectric layer 152, for example, through a damascene process. Bottom gate 150 may be formed of or comprise copper, aluminum, tungsten, nickel, cobalt, or the like, or combinations thereof. Alternative, bottom gate 150 and dielectric layer 152 are formed by depositing a metallic layer, patterning the metallic layer to form bottom gate 150, depositing a dielectric layer, and performing a planarization process.

Next, gate dielectric 145 is deposited, which may comprise silicon oxide or a high-k dielectric material such as hafnium oxide, lanthanum oxide, zirconium oxide, or the like. Channel layer 142, which may comprise InGaZnO, is then deposited. In subsequent processes, source regions(S) and drain regions (D) are formed over and contacting channel layer 142. Oxide layer 148 is formed between and separating source region 144 from drain region 146. The formation process may be similar to the formation of bottom gate 150 and dielectric layer 152.

In subsequent processes, the dielectric layer 148, channel layer 142, gate dielectric 145, and dielectric layer 152 are patterned in anisotropic etching processes, so that the portions of these layer outside of the thin-film transistor 40 are patterned, leaving thin-film transistor 40 standing over metal layer M(top-1). The top dielectric layer 38T (FIG. 2) may then be formed, followed by the formation of the vias 155

(FIGS. 9 and 10) for connecting to source regions 144 and drain regions 146. Metal layer Mtop may then be formed connecting to vias 155.

FIG. 9 illustrates thin-film transistor 40 in a larger view in accordance with some embodiments. In accordance with some embodiments, there are a plurality of source regions 144 and a plurality of drain regions 146 formed alternatingly. Each of the source regions 144 is connected to an overlying via 155. Each of the drain regions 146 is also connected to an overlying via 155. Through vias 155 and an overlying metal line 156 (also refer to FIG. 10) in metal layer Mtop, all of the drain regions 146 are interconnected. Through the vias 155 (marked as being dashed to indicate that they are not in the illustrated plane) and an overlying metal line 158 (FIG. 10) in metal layer Mtop, all of the source regions 144 are interconnected. Accordingly, thin-film transistor 40 includes a plurality of sub transistors connected in parallel, and hence may have a large current supporting the operation of a plurality of integrated circuit devices.

Figure 10:
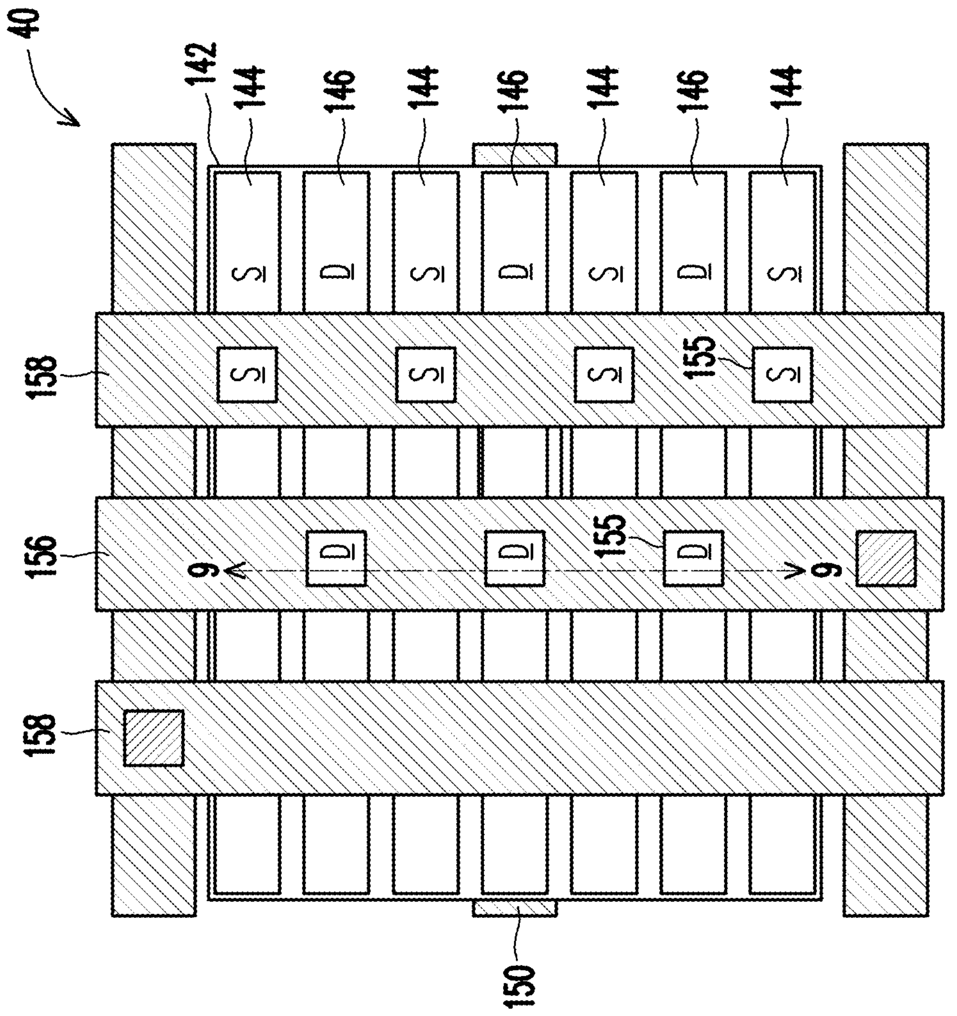

FIG. 10 illustrates a top view of a thin-film transistor 40 in accordance with some embodiments. Channel layer 142 may be formed as a long and wide sheet. Source regions 144 and drain regions may 146 be formed as a plurality of elongated strips in the top view. The elongated strips of source regions 144 are parallel to the elongated strips of drain regions 146, and are formed on channel layer 142. Bottom gate 150 may also be formed as an elongated strip or a plurality of elongated strips underlying and contacting the channel layer 142. Vias 155 connecting to source regions 144 and vias 155 connecting to drain regions 146 are also illustrated.

Figure 3:
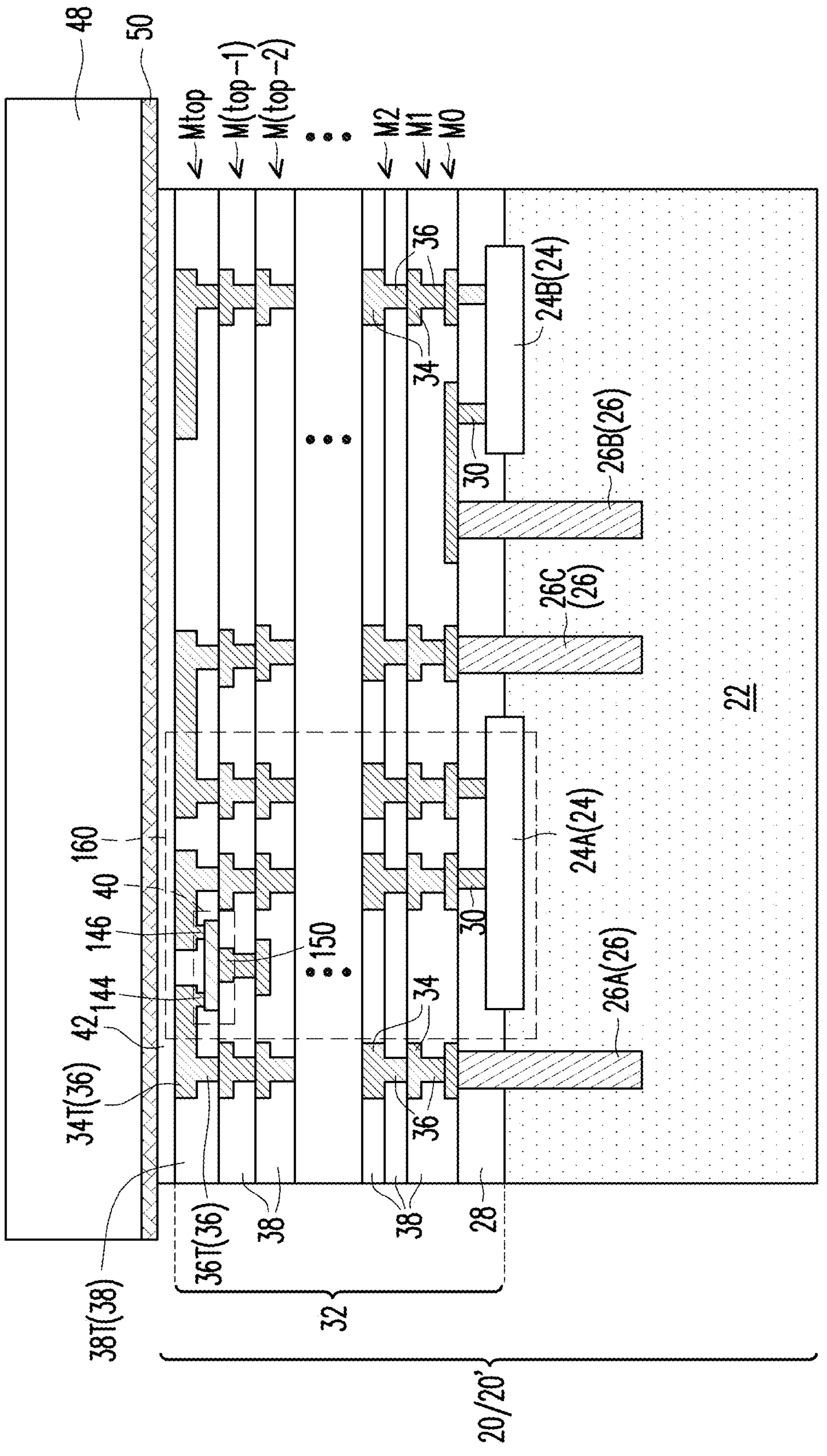

FIGS. 3 through 6 illustrate the process for forming backside features on the backside of semiconductor substrate 22. Referring to FIG. 3, carrier 48 (which may be a glass carrier) is attached to the front side of wafer 20. The respective process is illustrated as process 210 in the process flow 200 as shown in FIG. 15. The attachment may be performed through an adhesive such as a light-to-heat-Conversion (LTHC) material 50, which is configured to be decomposed under the heat of light (such as a laser beam).

In accordance with alternative embodiments, carrier 48 may be a supporting substrate, which may be a blank silicon substrate in accordance with some embodiments. The supporting substrate may be formed of a homogeneous material such as silicon, and there is no other material other than the homogeneous material in the supporting substrate. Layer 50 in accordance with these embodiments may be a bond layer formed of a silicon-containing dielectric material such as SiO, SiC, SiOC, SiON, SiOCN, or the like.

Figure 4:
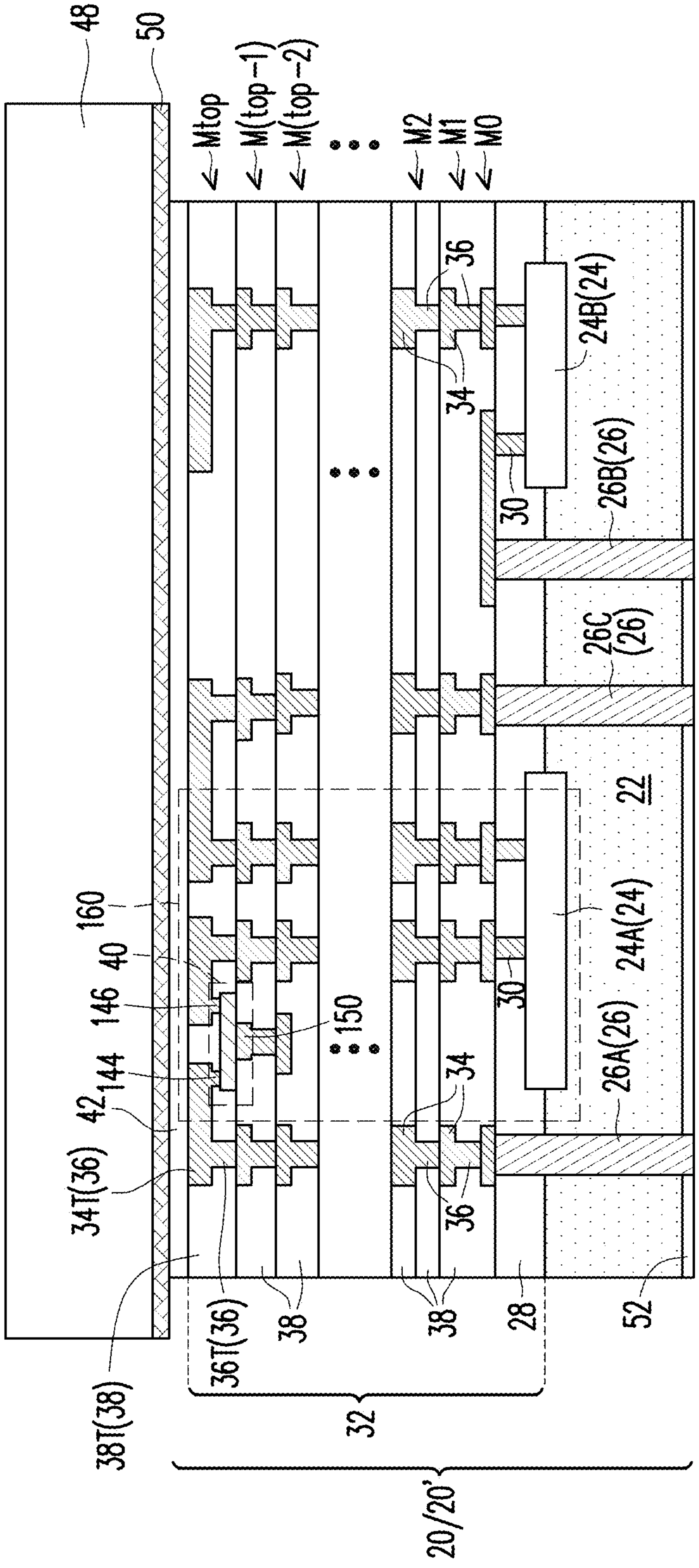

Referring to FIG. 4, a backside grinding process is performed to remove a portion of semiconductor substrate 22, until through-vias 26 are revealed. The respective process is illustrated as process 212 in the process flow 200 as shown in FIG. 15. Semiconductor substrate 22 is then recessed slightly (for example, through etching), so that end portions of through-vias 26 protrude out of the back surface of semiconductor substrate 22. Next, dielectric layer 52 is deposited, followed by a CMP process or a mechanical grinding process to re-expose through-vias 26. Through-vias 26 thus penetrate through dielectric layer 52 also. In accordance with some embodiments, dielectric layer 52 is formed of silicon oxide, silicon nitride, or the like.

Figure 5:
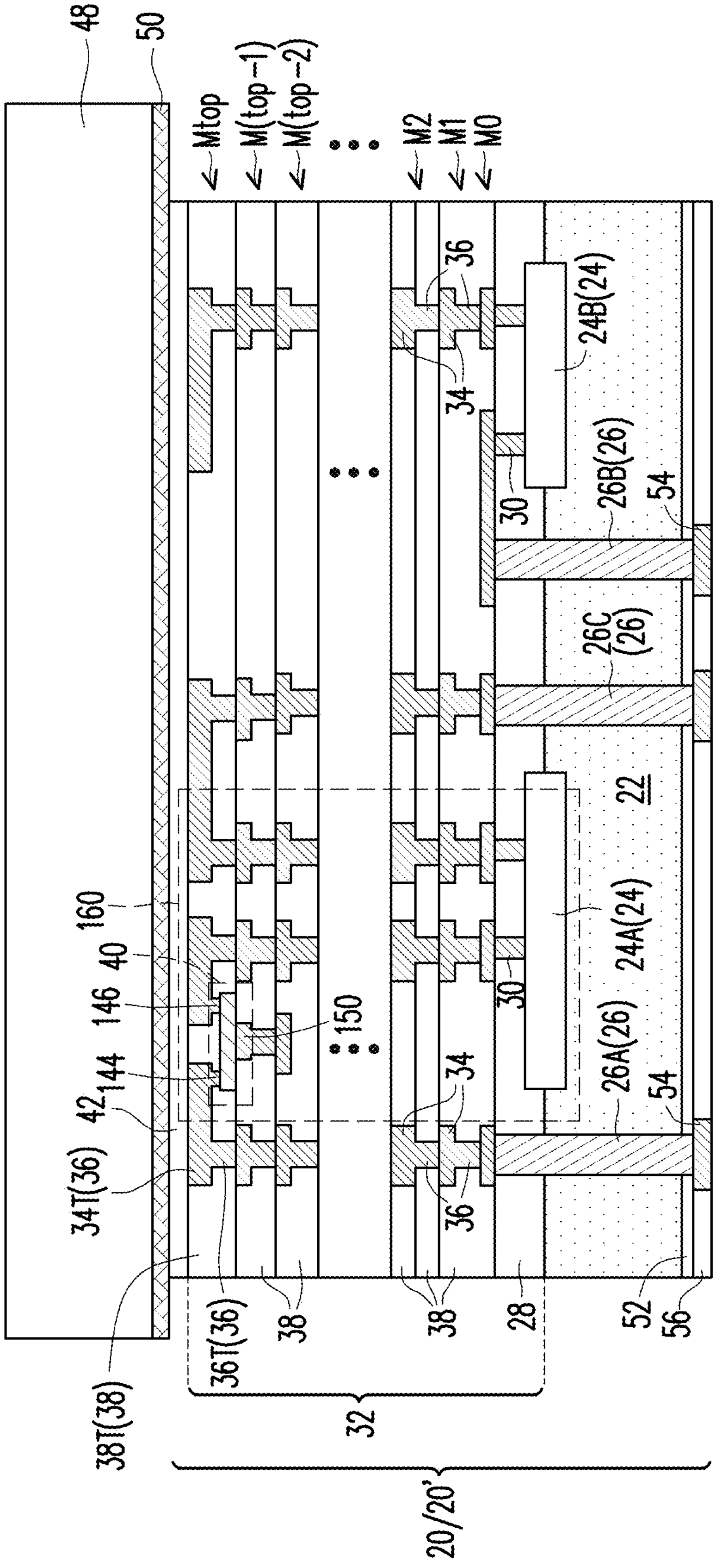

Referring to FIG. 5, metal pads 54 and dielectric layer 56 are formed. In accordance with some embodiments, the formation process may include depositing dielectric layer 56 on the backside of semiconductor substrate 22, etching dielectric layer 56 to form openings, through with through-vias 26 are formed, and filling the openings with conductive materials. The respective process is illustrated as processes 214 and 216 in the process flow 200 as shown in FIG. 15.

Figure 6:
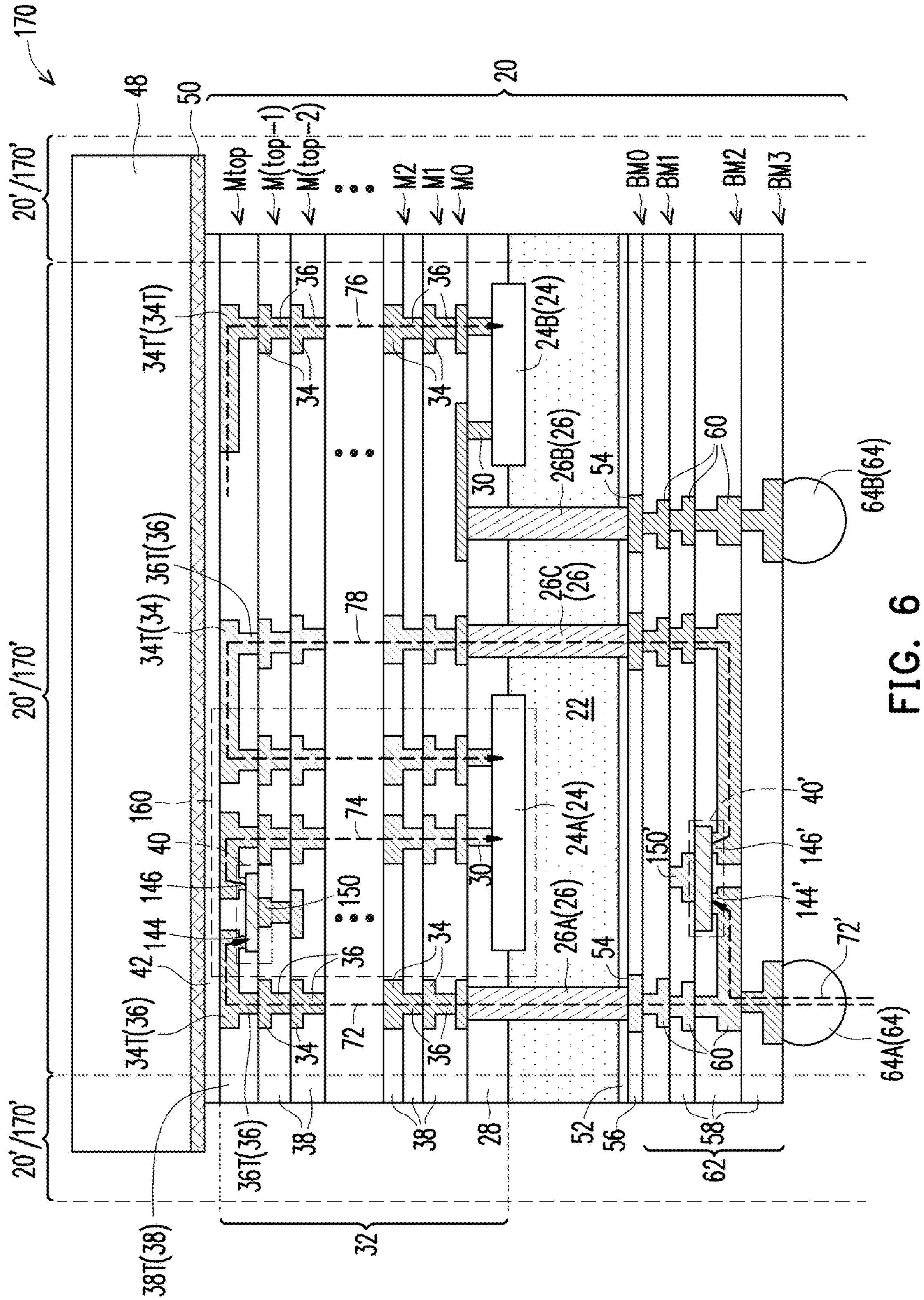

Referring to FIG. 6, in subsequent processes, backside interconnect structure 62 is formed. The respective process is illustrated as process 218 in the process flow 200 as shown in FIG. 15. Backside interconnect structure 62 may include dielectric layers 58, and RDLs 60 are formed in dielectric layers 58. RDLs 60 may be formed of or comprise aluminum, copper, nickel, tungsten, titanium, or the like. In accordance with some embodiments, the formation of a layer of RDLs 60 may include forming a dielectric layer 58, etching the respective dielectric layer 58 to form openings, plating a metal seed layer extending into the openings, forming a patterned plating mask, with some portions of the metal seed layer being exposed, and plating to form the RDLs 60. In accordance with alternative embodiments, RDLs 60 may be formed through damascene processes.

Figure 11:
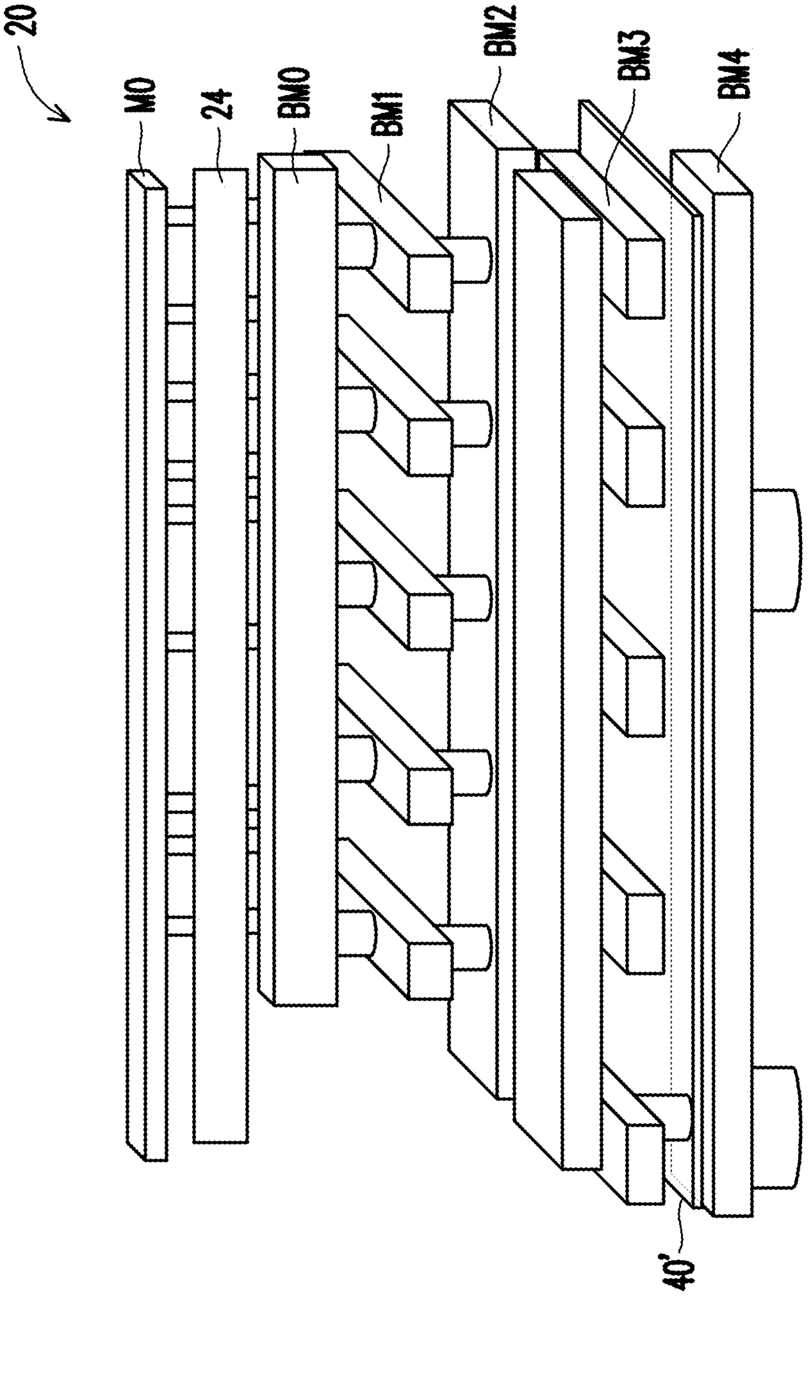

Thin-film transistor 40' may be formed inside backside interconnect structure 62. The respective process is illustrated as process 220 in the process flow 200 as shown in FIG. 15. In accordance with some embodiments, similar to thin-film transistor 40, thin-film transistor 40' is formed in a metal layer that is farther away from semiconductor substrate 22 than some other metal layers. For example, there may be four backside metal layers on the backside of semiconductor substrate 22, which metal layers are referred to as BM0, BM1, BM2, and BM3. Thin-film transistor 40' may be formed between metal layers BM2 and BM3, while it may also be formed between other neighboring backside metal layers (such as between metal layers BM3 and BM4 as shown in FIG. 11).

In accordance with some embodiments, backside voltage regulator circuits 160' may be formed on the backside of semiconductor substrate 22, and is connected to thin-film transistor 40'. The function of backside voltage regulator circuits 160' may be essentially the same as that of voltage regulator circuits 160, and the detailed structures and functions are not repeated herein. The backside voltage regulator circuits 160' may be connected to the integrated circuit devices 24 through backside RDLs, TSVs, and front side RDLs.

Thin-film transistor 40' may be formed using essentially the same processes, and may have similar or the same structure as, thin-film transistor 40. The structure of thin-film transistor 40 may thus be essentially the same as illustrated in FIGS. 8 through 10. Thin-film transistor 40' may include source region 144', gate 150', and drain region 146', as shown in FIG. 6.

In accordance with some embodiments, thin-film transistor 40' is formed on the backside of semiconductor substrate 22, while thin-film transistor 40 is not formed. In accordance with alternative embodiments, thin-film transistor 40 is formed on the front side of semiconductor substrate 22, while thin-film transistor 40' is not formed. In accordance with yet alternative embodiments, both of thin-film transistor 40 and thin-film transistor 40' are formed.

FIG. 11 illustrates a perspective view of parts of the backside structure of wafer 20 in accordance with some embodiments. Front-side metal layer M0 (on the front side of substrate 22), integrated circuit devices 24, and metal layers BM0 through BM4 (on the backside of substrate 22) are illustrated. Thin-film transistor 40' is illustrated as being formed between metal layers BM3 and BM4 in accordance with some embodiments.

Referring again to FIG. 6, electrical connectors 64 are formed. The respective process is illustrated as process 222 in the process flow 200 as shown in FIG. 15. In accordance with some embodiments, electrical connectors 64 include solder regions, which may be formed by plating solder balls on the metal pads of RDLs 60, and reflowing the solder balls. In accordance with alternative embodiments, electrical connectors 64 are formed of non-reflowable (non-solder) metallic materials. For example, electrical connectors 64 may be formed as a copper pads or pillars, and may or may not include nickel capping layers. Reconstructed wafer 170 is thus formed.

When carrier 48 is a glass carrier, carrier 48 may be de-bonded from the underlying wafer 20. The respective process is illustrated as process 224 in the process flow 200 as shown in FIG. 15. In accordance with alternative embodiments when carrier 48 is a silicon supporting substrate, and is bonded to wafer 20 through fusion bonding, supporting substrate 48 may be removed, or may remain on wafer 20 when singulated. Reconstructed wafer 170 may then be singulated into a plurality of identical packages 170', each including one of device dies 20', and may or may not include carrier 48 therein.

As shown in FIG. 6, in accordance with some embodiments, when thin-film transistor 40 is formed, a True VDD (TVDD) voltage (also referred to as power TVDD or power supply voltage TVDD) may be passed in from electrical connector 64A into device die 20'. In accordance with some embodiments, the TVDD voltage is 12V, while it may also be another voltage. The TVDD voltage is conducted through electrical path 72 (which includes the RDLs 60, through-via 26A, metal lines 34, and vias 36) to thin-film transistor 40.

The TVDD voltage is provided to source region 144 (also refer to FIG. 8), which is alternatively referred to as a TVDD node. The voltage on drain region 146 may be referred to as a Virtual VDD (VVDD) voltage (also referred to as power VVDD or power supply voltage VVDD). Drain region 146 is thus referred to as a VVDD node, which receives the power when thin-film transistor 40 is turned on, and is cut from the power when thin-film transistor 40 is turned off. The power VVDD on the VVDD node 146 is provided to voltage regulators 160 and integrated circuit devices (which may include a power user circuit) 24A through electrical path 74.

The TVDD voltage may also be conducted to metal line 34T', which is a part of the top metal lines 34T. The connecting metal line portion that connects the top metal pad of electrical path 72 to metal line 34T' are not illustrated, and may be in the unillustrated planes. The metal line 34T may also be referred to as an always-on node since whenever electrical connector 64A has power, metal line 34T has power. Through electrical path 76, voltage TVDD is provided to integrated circuit devices 24B, regardless of whether integrated circuit devices 24A is cut from power or provided with power. The voltage regulators for converting the higher voltage TVDD to lower voltages that are used by integrated circuit devices 24B are not shown, while the voltage regulators may also exist. The voltages may also be essentially the same as voltage regulators 160.

FIG. 6 schematically illustrates voltage regulator circuits 160, which may expand into the surface area of semiconductor substrate 22, and into interconnect structure 32. In accordance with some embodiments, as will be shown in FIG. 12, a (high) power supply voltage Vin is directly input into device die 20'. The power supply voltage Vin may be provided to power switch 40.

Figure 14:
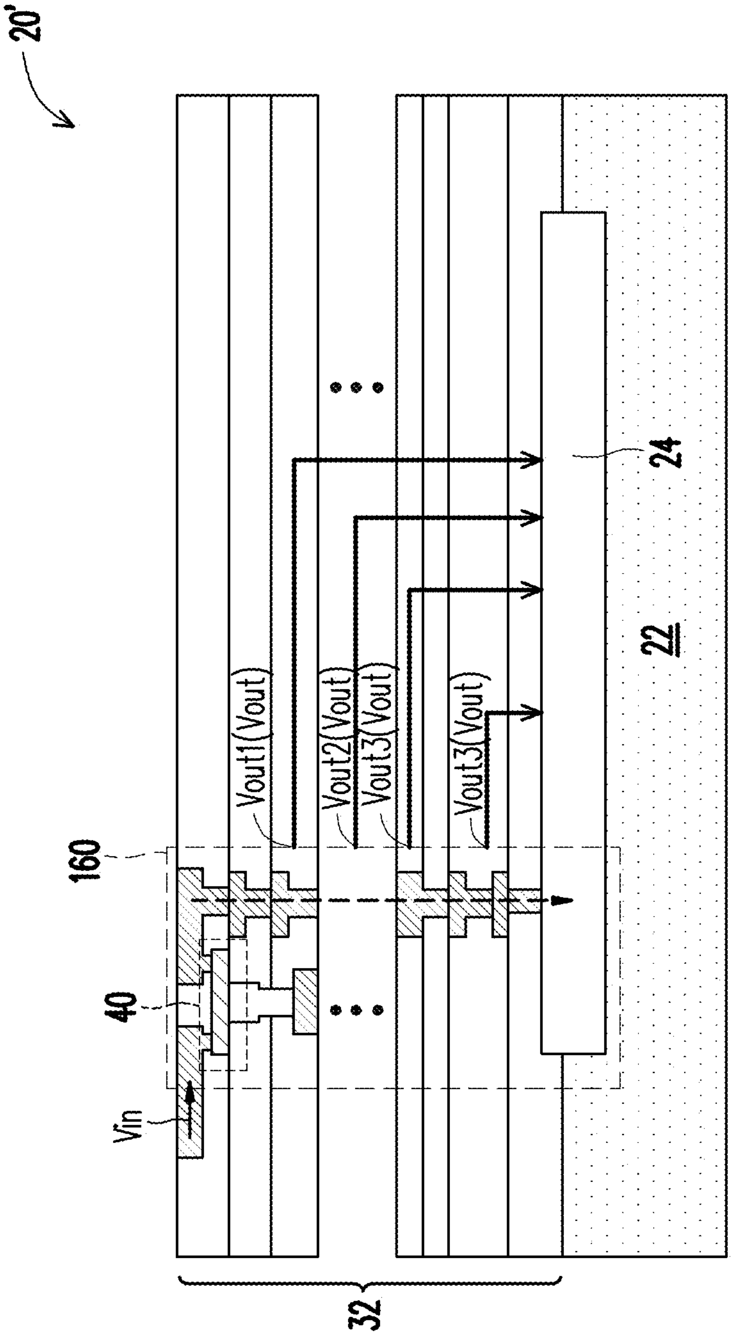
FIG. 14 illustrates embedded voltage regulators for converting higher power supply voltages into lower power supply voltages in accordance with some embodiments.

FIG. 14 schematically illustrates a part of device die 20' in accordance with some embodiments. The illustrated part includes the voltage regulator circuits 160. In accordance with some embodiments, voltage regulator circuits 160 receives input power supply voltage Vin, and generates a plurality of output power supply voltages Vout such as Vout1, Vout2, Vout3, or the like. In accordance with some embodiments, the input power supply voltage Vin may be 12V, while it may also be higher or lower, depending on the respective circuit configurations. The output power supply voltages Vout may be voltages that are lower than the input power supply voltage Vin, and may be 5V, 3.3V, 1.2V, 0.9V, 0.75V, and the like. The output power supply voltages Vout are provided to integrated circuit devices 24.

In accordance with some embodiments, the voltage regulator circuits 160 include the devices for reducing power supply voltages, which devices may include resistors, voltage followers, amplifiers, capacitors, inductors, diodes, and the like. Accordingly, the voltage regulator circuits 160 may include some portions inside semiconductor substrate 22, and some portions in interconnect structure 32. The details of the devices in voltage regulator circuits 160 and used for reducing power supply voltages are not illustrated herein. Although not illustrated, the voltage regulator circuits 160 (which includes power switch 40) may also include power switch 40' (FIG. 6), and may or may not include the devices (such as resistors, capacitors, inductors, and the like) and structures formed in the backside interconnect structure.

Referring back to FIG. 6, device die 20' also have signal through-via 26B, which is connected to electrical connector 64B, and is used to conduct signals to integrated circuit devices 24B.

In accordance with some embodiments, when thin-film transistor 40' is formed on the backside of semiconductor substrate 22, power TVDD may be passed in from electrical connector 64A to thin-film transistor 40' through electrical path 72'. Drain region 146' is a VVDD node, which receives the power when thin-film transistor 40' is turned on, and is cut from the power when thin-film transistor 40' is turned off. The power on the VVDD node 146' is provided to a power user circuit 24A through electrical path 78, which includes the RDLs 60, through-via 26A, metal lines 34, and vias 36. Electrical path 78 may include an upper metal line such as a top metal line 34T in the top metal layer. The electrical path 78 also includes metal lines 34 and vias 36 connecting from the top metal line 34T to integrated circuit devices 24A.

Figure 12:
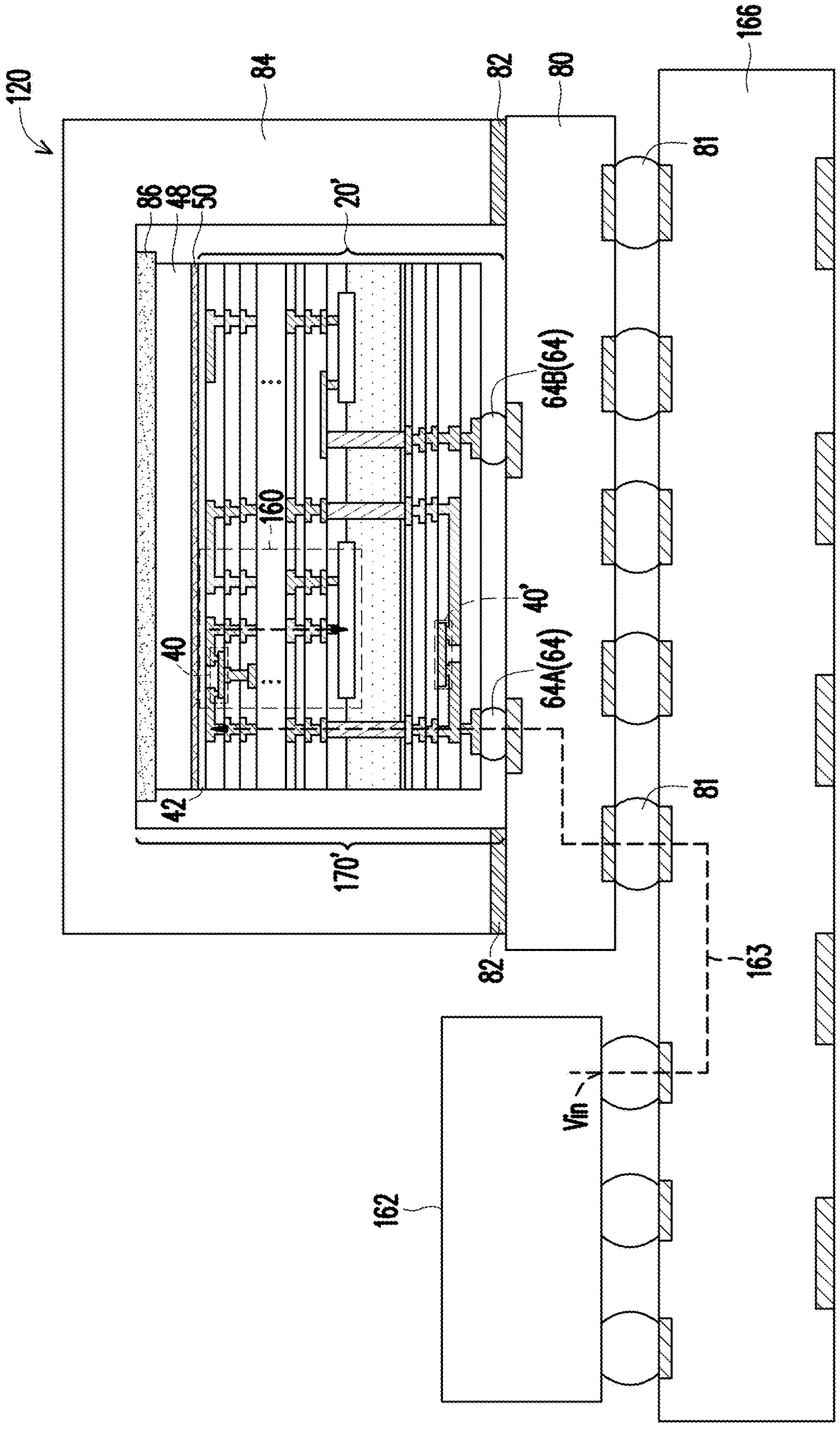
FIG. 12 illustrates the packaging of a device die including embedded voltage regulators in accordance with some embodiments.
Figure 13:
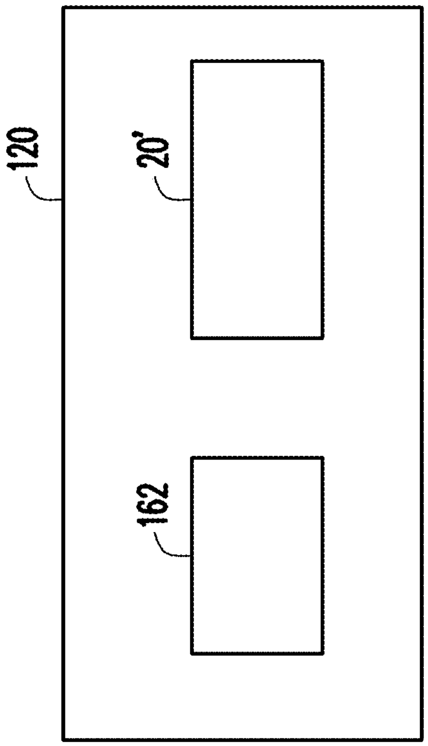
FIG. 13 illustrates a top view of a package including a power supply die and a device die in accordance with some embodiments.

FIG. 12 illustrates a package 120 including device die 20' in accordance with some embodiments. Device die 20' is bonded to package component 80. Package component 80 may be a silicon interposer, an organic interposer, a package substrate, a package, or the like. Package component 80 may be further bonded to package component 166, which may be a printed circuit board or a like package component. In accordance with some embodiments, heat sink 84 is attached to carrier 48 through thermal interface material 86, and to package component 80 through adhesive 82.

Power supply die 162 is also bonded to package component 166. In accordance with some embodiments, the power supply die 162 may receive a power supply voltage higher than power supply voltage Vin, or may receive an AC power supply, and generates power supply voltage Vin. The power supply voltage Vin may be transferred through conductive path 163, which goes through package components 166 and 80. The power supply voltage Vin is input directly into die 20', and is converted to lower power supply voltages inside die 20', rather than outside of die 20' and in other package components that are bonded to package component 166.

The embodiments of the present disclosure have some advantageous features. By providing high power supply voltages such as a 12V voltage into a device die directly, and converting the high voltage power supply voltages to lower power supply voltages inside the device die, the lower power supply voltages are not conducted outside of the device dies such as through printed circuit boards, package substrates, interposers, or the like. The low power supply voltages thus have much shorter conduction paths. Since the lower power supply voltages suffer from higher power loss than higher power supply voltages, the overall power loss is reduced. Furthermore, by forming power switches in the interconnect structures of device dies such as in the back-end-of-line structures and/or the backside interconnect structures of the device dies, rather than on the surface of semiconductor substrates, the chip area is saved.

In accordance with some embodiments of the present disclosure, a method comprises forming integrated circuit devices on a semiconductor substrate of a wafer; forming a voltage regulator in the wafer; forming a first metal layer as a part of the wafer; forming a transistor farther away from the semiconductor substrate than the first metal layer, wherein the transistor comprises a first source/drain region connected to the voltage regulator, and the voltage regulator is configured to convert a first voltage received from the first source/drain region to a second voltage that is lower than the first voltage, and provide the second voltage to the integrated circuit devices; and forming an electrical connector on a surface of the wafer, wherein the electrical connector is electrically connected to a second source/drain region of the transistor.

In an embodiment, the method further comprises sawing the wafer to form a device die; bonding the device die to a package component; and bonding a power die to the package component, wherein the power die generates the first voltage, and the first voltage is provided to the second source/drain region of the transistor. In an embodiment, the power die is configured to convert an AC power to the first voltage. In an embodiment, the package component comprises a printed circuit board. In an embodiment, the first voltage is 12 volts, and the second voltage is selected from the group consisting of 5V, 3.3V, 1.2V, 0.9V, and 0.75V. In an embodiment, the forming the transistor comprises forming a metal oxide layer as a channel layer; forming a gate dielectric contacting the metal oxide layer; forming a gate electrode contacting the gate dielectric; and forming the first source/drain region and the second source/drain region contacting the metal oxide layer.

In an embodiment, the method further comprises forming a second metal layer farther away from the semiconductor substrate than the first metal layer, wherein the metal oxide layer is formed between the first metal layer and the second metal layer. In an embodiment, the transistor is formed on a front side of the wafer. In an embodiment, the electrical connector is formed on a backside of the wafer.

In accordance with some embodiments of the present disclosure, a structure comprises a device die comprising a semiconductor substrate; integrated circuit devices on a surface of the semiconductor substrate; a voltage regulator comprising an input; and a plurality of outputs, wherein the voltage regulator is configured to convert a first voltage received from the input to a plurality of second voltages lower than the first voltage, and wherein the plurality of outputs are electrically connected to the integrated circuit devices; and an electrical connector at a surface of device die, wherein the device die is configured to pass the first voltage received from the electrical connector to the input.

In an embodiment, the voltage regulator is configured to convert the first voltage of 12 volts into the plurality of second voltages that are selected from the group consisting of 5V, 3.3V, 1.2V, 0.9V, 0.75V, and combinations thereof. In an embodiment, the structure further comprises a plurality of metal layers over the integrated circuit devices; and a transistor over the plurality of metal layers, wherein the transistor is configured to turn on and turn off conduction of the first voltage received from the electrical connector to the voltage regulator. In an embodiment, the transistor comprises a thin-film transistor.

In an embodiment, the device die further comprises a through-via penetrating through the semiconductor substrate, wherein the through-via electrically connects the electrical connector to the transistor. In an embodiment, the transistor is configured to provide power to the voltage regulator when the transistor is turned on, and is configured to cut off power to the voltage regulator when the transistor is turned off. In an embodiment, the structure further comprises a package component, wherein the device die is over and electrically connected to the package component; and a power die over and joined to the package component, wherein the power die is configured to generate the first voltage that is provided to the voltage regulator.

In accordance with some embodiments of the present disclosure, a structure comprises a device die comprising a semiconductor substrate; integrated circuit devices at a surface of the semiconductor substrate; a voltage regulator comprising an output connected to the integrated circuit devices, and an input; a plurality of metal layers on the semiconductor substrate; and a transistor in the plurality of metal layers, wherein the transistor comprises a first source/drain region connecting to the input of the voltage regulator; and a second source/drain region; and an electrical connector at a surface of the device die, wherein the electrical connector is electrically connected to the second source/drain region; a printed circuit board underlying and electrically connected to the device die; and a power die configured to generate a power supply voltage, wherein the structure is configured to connect the power supply voltage to the second source/drain region of the transistor.

In an embodiment, the transistor comprises a thin-film transistor. In an embodiment, the power die is configured to generate the power supply voltage that is 12V. In an embodiment, the voltage regulator is configured to generate a plurality of different output voltages.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming integrated circuit devices on a semiconductor substrate of a wafer;

forming a voltage regulator in the wafer;

forming a first metal layer as a part of the wafer;

forming a transistor farther away from the semiconductor substrate than the first metal layer, wherein the transistor comprises a first source/drain region connected to the voltage regulator, and the voltage regulator is configured to convert a first voltage received from the first source/drain region to a second voltage that is lower than the first voltage, and provide the second voltage to the integrated circuit devices; and forming an electrical connector on a surface of the wafer, wherein the electrical connector is electrically connected to a second source/drain region of the transistor.

2. The method of claim 1 further comprising:

sawing the wafer to form a device die;

bonding the device die to a package component; and bonding a power die to the package component, wherein the power die generates the first voltage, and the first voltage is provided to the second source/drain region of the transistor.

3. The method of claim 2, wherein the power die is configured to convert an AC power to the first voltage.

4. The method of claim 2, wherein the package component comprises a printed circuit board.

5. The method of claim 1, wherein the first voltage is 12 volts, and the second voltage is selected from the group consisting of 5V, 3.3V, 1.2V, 0.9V, and 0.75V.

6. The method of claim 1, wherein the forming the transistor comprises:

forming a metal oxide layer as a channel layer;

forming a gate dielectric contacting the metal oxide layer;

forming a gate electrode contacting the gate dielectric; and forming the first source/drain region and the second source/drain region contacting the metal oxide layer.

7. The method of claim 6 further comprising forming a second metal layer farther away from the semiconductor substrate than the first metal layer, wherein the metal oxide layer is formed between the first metal layer and the second metal layer.

8. The method of claim 1, wherein the transistor is formed on a front side of the wafer.

9. The method of claim 8, wherein the electrical connector is formed on a backside of the wafer.

10. A structure comprising:

a device die comprising:

a semiconductor substrate;

integrated circuit devices on a surface of the semiconductor substrate;

a voltage regulator comprising:

an input; and a plurality of outputs, wherein the voltage regulator is configured to convert a first voltage received from the input to a plurality of second voltages lower than the first voltage, and wherein the plurality of outputs are electrically connected to the integrated circuit devices; and an electrical connector at a surface of the device die, wherein the device die is configured to pass the first voltage received from the electrical connector to the input.

11. The structure of claim 10, wherein the voltage regulator is configured to convert the first voltage of 12 volts into the plurality of second voltages that are selected from the group consisting of 5V, 3.3V, 1.2V, 0.9V, 0.75V, and combinations thereof.

12. The structure of claim 10 further comprising:

a plurality of metal layers over the integrated circuit devices; and a transistor over the plurality of metal layers, wherein the transistor is configured to turn on and turn off conduction of the first voltage received from the electrical connector to the voltage regulator.

13. The structure of claim 12, wherein the transistor comprises a thin-film transistor.

14. The structure of claim 12, wherein the device die further comprises:

a through-via in the semiconductor substrate, wherein the through-via electrically connects the electrical connector to the transistor.

15. The structure of claim 12, wherein the transistor is configured to provide power to the voltage regulator when the transistor is turned on, and is configured to cut off power to the voltage regulator when the transistor is turned off.

16. The structure of claim 12 further comprising:

a package component, wherein the device die is over and electrically connected to the package component; and a power die over and joined to the package component, wherein the power die is configured to generate the first voltage that is provided to the voltage regulator.

17. A structure comprising:

a device die comprising:

a semiconductor substrate;

integrated circuit devices at a surface of the semiconductor substrate;

a voltage regulator comprising an output connected to the integrated circuit devices, and an input;

a plurality of metal layers on the semiconductor substrate; and a transistor in the plurality of metal layers, wherein the transistor comprises:

a first source/drain region connected to the input of the voltage regulator; and a second source/drain region; and an electrical connector at a surface of the device die, wherein the electrical connector is electrically connected to the second source/drain region;

a printed circuit board underlying and electrically connected to the device die; and a power die configured to generate a power supply voltage, wherein the structure is configured to connect the power supply voltage to the second source/drain region of the transistor.

18. The structure of claim 17, wherein the transistor comprises a thin-film transistor.

19. The structure of claim 17, wherein the power die is configured to generate the power supply voltage that is 12V.

20. The structure of claim 17, wherein the voltage regulator is configured to generate a plurality of different output voltages.

* * * * *